(12) United States Patent
Fukano et al.

(10) Patent No.: US 7,649,799 B2
(45) Date of Patent: Jan. 19, 2010

(54) SEMICONDUCTOR MEMORY DEVICE

(75) Inventors: Gou Fukano, Fuchu (JP); Tomoaki Yabe, Kawasaki (JP); Nobuaki Otsuka, Komae (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 82 days.

(21) Appl. No.: 11/952,441

(22) Filed: Dec. 7, 2007

(65) Prior Publication Data
US 2008/0137393 A1    Jun. 12, 2008

(30) Foreign Application Priority Data
Dec. 8, 2006    (JP)    .............................. 2006-331992

(51) Int. Cl.
*G11C 8/00* (2006.01)
(52) U.S. Cl. .............................. 365/230.03; 365/210.1; 365/200; 365/230.06
(58) Field of Classification Search ............ 365/230.03, 365/210.1, 200, 230.06, 205, 189.15, 230.08, 365/185.13
See application file for complete search history.

(56) References Cited
U.S. PATENT DOCUMENTS
6,339,556 B1    1/2002   Watanabe

| | | |
|---|---|---|
| 6,831,862 B2 | 12/2004 | Tedrow et al. |
| 6,982,911 B2 * | 1/2006 | Oh .............................. 365/200 |
| 7,027,342 B2 * | 4/2006 | Inoue ..................... 365/210.12 |
| 2007/0047368 A1 | 3/2007 | Imai et al. |

FOREIGN PATENT DOCUMENTS

| JP | 11-191291 | 7/1999 |
|---|---|---|
| JP | 2005-166098 | 6/2005 |

OTHER PUBLICATIONS

U.S. Appl. No. 10/959,210, filed Oct. 7, 2004, Yabe.
U.S. Appl. No. 12/134,750, filed Jun. 6, 2008, Fukano.

* cited by examiner

*Primary Examiner*—David Lam
(74) *Attorney, Agent, or Firm*—Oblon, Spivak, McClelland, Maier & Neustadt, L.L.P.

(57) ABSTRACT

This semiconductor memory device comprises a plurality of sub-arrays with a plurality of memory cells arranged in matrix form. Each local bit line is connected to a plurality of memory cells that are arranged in column direction in the sub-arrays. In addition, a global bit line is connected to the plural local bit lines. A column decoder is connected to the global bit line. The global bit line extends from the column decoder toward the plurality of sub-arrays, and it is cut before the furthest sub-array formed in the furthest region from that column decoder.

10 Claims, 7 Drawing Sheets

SEMICONDUCTOR MEMORY DEVICE

CROSS REFERENCE TO RELATED APPLICATIONS

This application is based on and claims the benefit of priority from prior Japanese Patent Application No. 2006-331992, filed on Dec. 8, 2006, the entire contents of which are incorporated herein by reference.

BACKGROUND OF THE INVENTION

1. Field of the Invention

The present invention relates to a semiconductor memory device, and, in particular, to a semiconductor memory device employing a hierarchical bit line configuration.

2. Description of the Related Art

Since capacity of semiconductor memory devices have increased in recent years, the number of memory cells connected to a pair of bit-lines is increasing. Accordingly, parasitic capacitance of bit lines is also increasing, thus lowering an operating speed.

In addition, when data is read from a memory cell that is connected to bit lines with an increased parasitic capacitance, it is necessary to sense output signals with small amplitude from the bit lines. For this purpose, a sense amplifier with small input offsets is required and a larger area needs to be provided as a region for forming the sense amplifiers.

However, developments in semiconductor memory devices are in trends of further refinements and integrations. It is against such trends to form a large-sized sense amplifier in semiconductor memory devices.

Therefore, in order to prevent reduction in operating speed and to provide as large amplitudes to be sensed as possible, certain configurations are proposed for dividing a memory cell array into a plurality of cell arrays in column direction. Such configurations may reduce the number of memory cells to be connected to a pair of bit lines and thereby reduce the capacity provided by the bit lines. Those configurations include hierarchical bit lines; one bit line that is connected to a memory cell in each cell array is called a "local bit line", and toe other common bit line that corresponds to a plurality of cell arrays is called "a global bit line". One of the semiconductor memory devices so configured is described, e.g., in Japanese Patent Laid-Open Publication Nos. 2005-166098 and 2005-267686.

SUMMARY OF THE INVENTION

A semiconductor memory device according to one aspect of the present invention comprises: a plurality of sub-arrays with a plurality of memory cells arranged in matrix form; a local bit line connected to a plurality of memory cells, the plurality of memory cells being arranged in column direction in the sub-arrays; a global bit line connected to a plurality of the local bit lines; and a column decoder connected to the global bit line; wherein the global bit line extends from the column decoder toward the plurality of sub-arrays, while being cut before the furthest sub-array formed in the furthest region from the column decoder.

DETAILED DESCRIPTION OF THE EMBODIMENTS

First Embodiment

One embodiment of the present invention will now be described below.

Figure 1A:
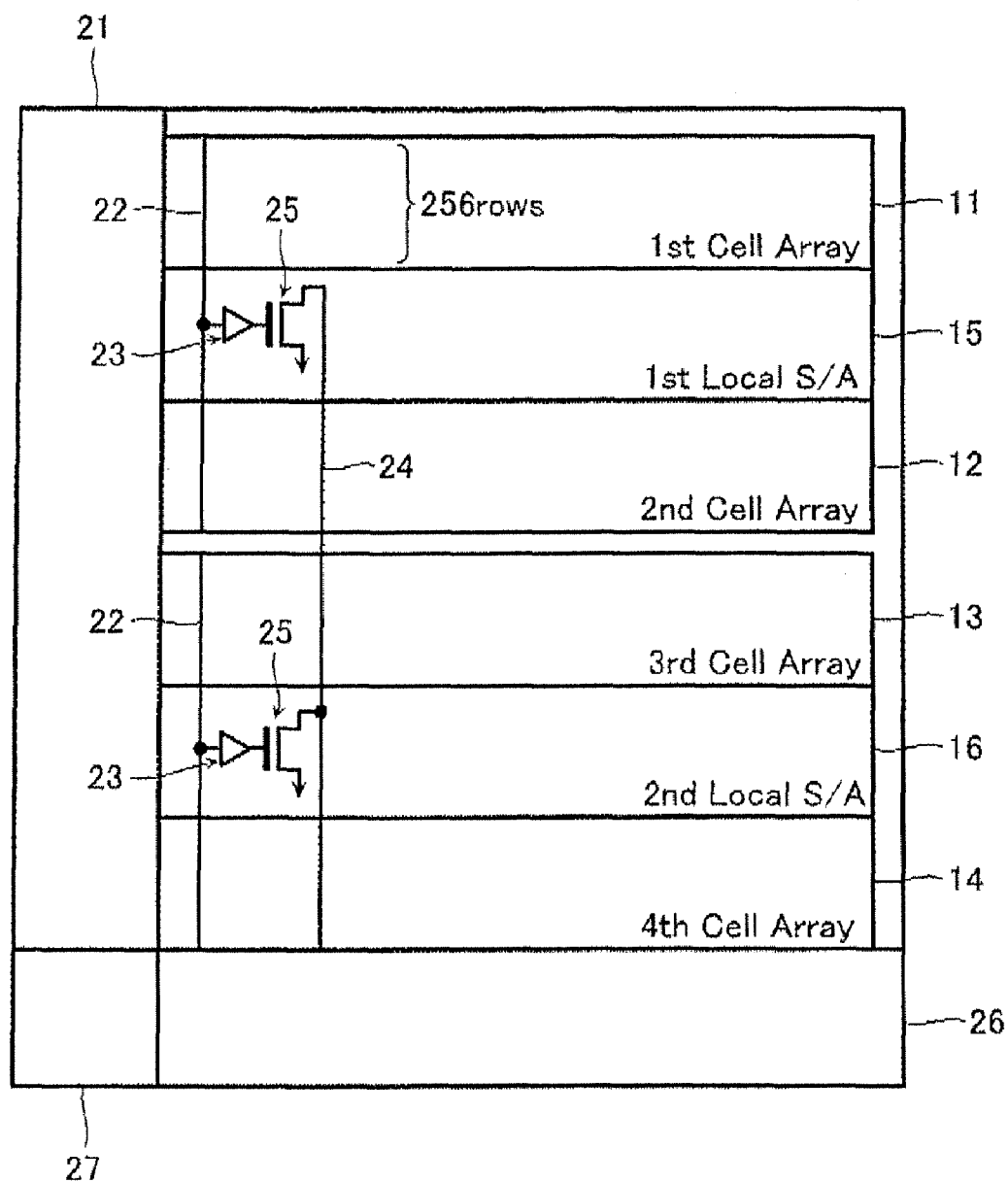
FIG. 1A is a configuration diagram of a semiconductor memory device according to a first embodiment.

FIG. 1A illustrates a configuration of a semiconductor memory device according to this embodiment. The semiconductor memory device of this embodiment comprises an SRAM (Static Random Access Memory). Specifically, each memory cell comprises a flip-flop circuit, which includes two p-type transistors and two n-type transistors, and two n-type transistors for switching.

A memory cell array of this embodiment has a plurality of sub-arrays with a plurality of memory cells arranged in matrix form. Specifically, the memory cell array of this embodiment has a first cell array 11, a second cell array 12, a third cell array 13, and a fourth cell array 14, each corresponding to a sub-array. One sub-array has, e.g., 256 word lines.

Provided between the first cell array 11 and the second cell array 12 is a first local sense amplifier region 15; and provided between the third cell array 13 and the fourth cell array 14 is a second local sense amplifier region 16.

In addition, a plurality of memory cells arranged in a row direction in the first cell array 11, the second cell array 12, the third cell array 13, and the fourth cell array 14 are connected to a word line (not shown). The word line is connected to a row decoder 21. On the other hand, a plurality of memory cells arranged in a column direction in the first cell array 11, the second cell array 12, the third cell array 13, and the fourth cell array 14 (each corresponding to a sub-array) are connected to a local bit line 22 per sub-array. A plurality of local bit lines 22 connected to the memory cells arranged in the column direction, are also connected to a local sense amplifier (S/A) 23 formed in the first local sense amplifier region 15. An output of the local, sense amplifier 23 is connected to an n-type MOS transistor 25 for driving a global bit line 24. Further, the global bit line 24 is connected to a column decoder 26. The row decoder 21 and the column decoder 26 are connected to and controlled by a controller 27.

In such hierarchical bit line configurations, data input to the global bit line 24 may be transferred to the local bit line 22 to write information in each of the memory cells. In addition, such information written in each of the memory cells may be transferred and read from the local bit line 22 to the global bit line 24.

In this embodiment, since the global bit line 24 is formed so as to only extend from the fourth cell array 24 to the first local sense amplifier region 15, the global bit line 24 is not formed in the first cell array 11, which corresponds to the furthest sub-array from the column decoder 26. This may reduce the length of the global bit line 24 to be formed, thereby reducing the overall parasitic capacitance and parasitic resistance formed by the global bit line 24.

Figure 1B:
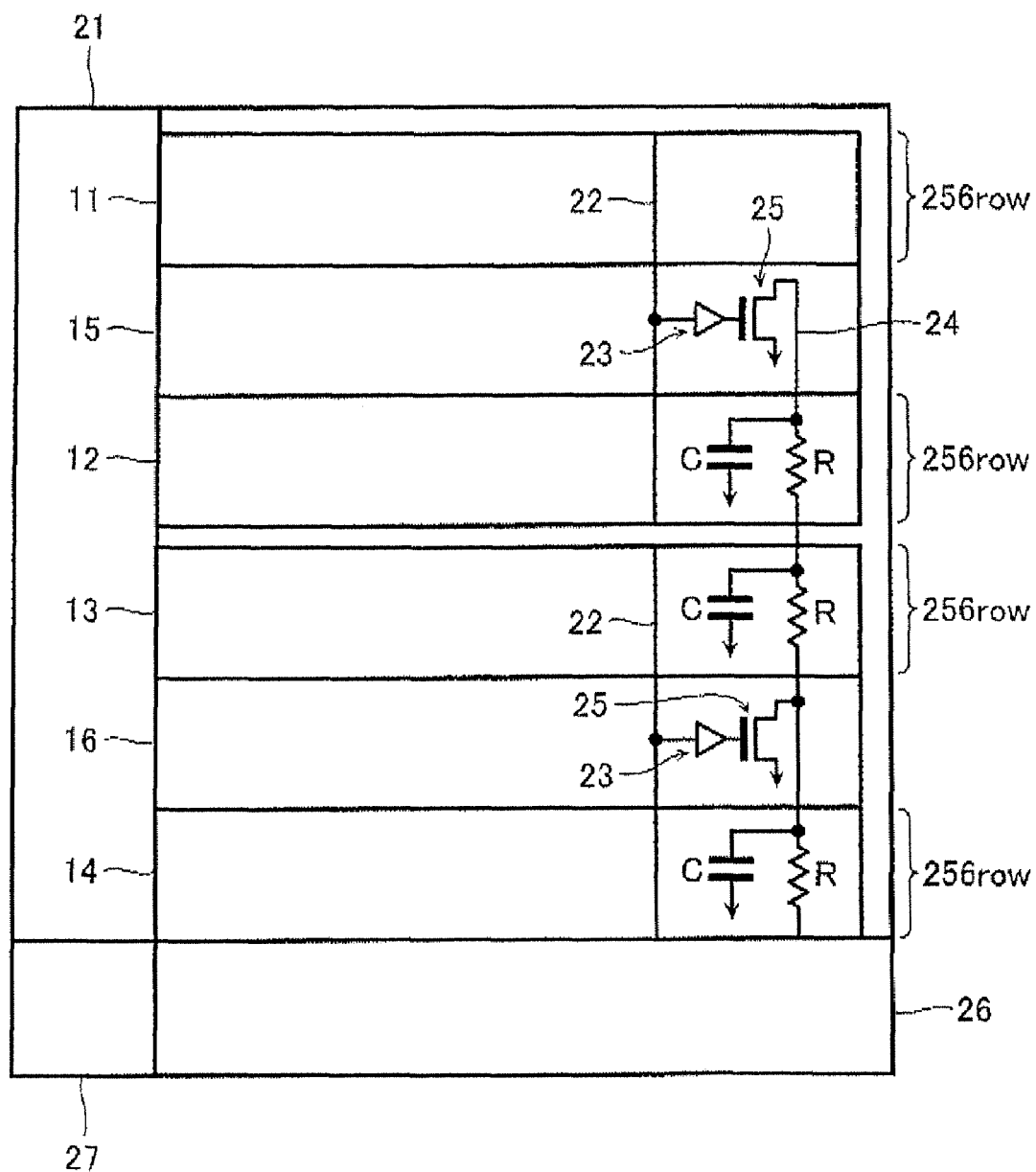
FIG. 1B is a diagram for illustrating advantages of the first embodiment.
Figure 1C:
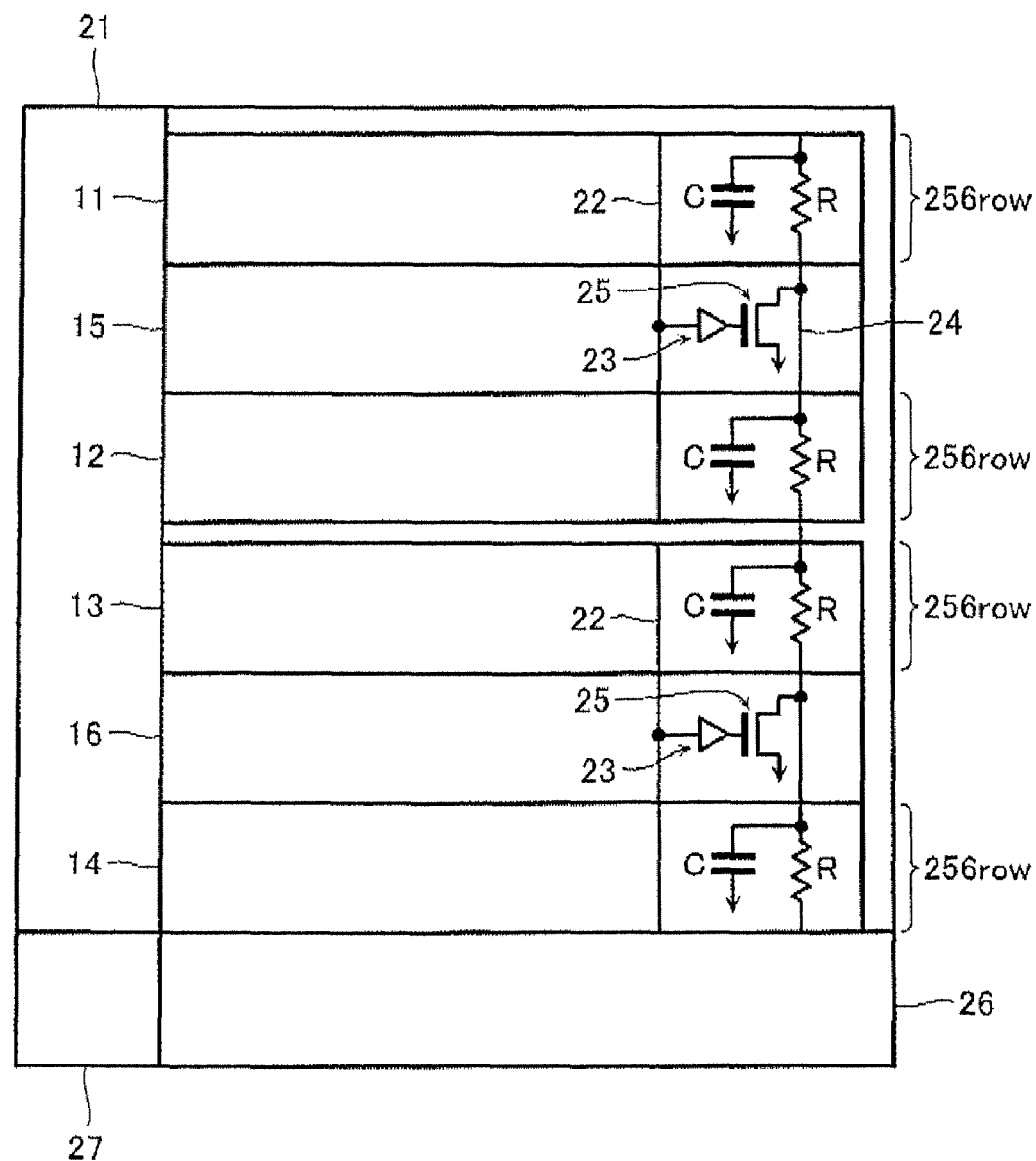
FIG. 1C is for illustrating advantages of the first embodiment.

In this regard, detailed description will be made with reference to FIGS. 1B and 1C. FIG. 1B schematically illustrates a parasitic capacitance and parasitic resistance in this embodiment. In this embodiment, the global bit line 24 is not formed in the first cell array 11. Thus, the global bit line 24 has a three-fourths (¾) length in comparison to the case where the global bit line 24 is formed so as to extend to the end of the first cell array 11 (FIG. 1C). A wiring delay $\tau$ is determined by the product of a parasitic capacitance C and a parasitic resistance R. Therefore, the wiring delay $\tau$ would be reduced to ¾×¾=9/16 (56%) in comparison to the case of FIG. 1C.

In this way, the length of the global bit line 24 as well as the parasitic capacitance and parasitic resistance are reduced, which may reduce the operating time delay that could be caused by the parasitic capacitance and parasitic resistance and enable high-speed operation. In this embodiment, the description has been made in conjunction with an exemplary case where four sub-arrays 11-14 are provided. Generally speaking, it is assumed that, when there are provided n sub-arrays, global bit lines are wired only to (n−1) sub-arrays, while no global bit line is wired to the other one furthest sub-array. In this case, the wiring delay $\tau$ would be $((N-1)/N)^2$ in comparison to the case where a global bit line is also wired to the furthest sub-array. The larger the value of N, the smaller the effect of possible reduction in wiring delay $\tau$, while the smaller the value of N, a larger effect would be expected.

In addition, since the local bit line 22 is formed in the first cell array 11, there poses no problem in operation even if the global bit line 24 is not formed in the first cell array 11.

In this embodiment, high-speed operation may be provided, especially in the first cell array 11. That is, a parasitic capacitance would be formed in the second cell array 12, the third cell array 13, and the fourth cell array 14, respectively, by a local bit line (not shown) and the global bit line 24; whereas no such parasitic capacitance would be formed in the first cell array 11. Therefore, the operating speed in the first cell array 11 is different from those in the second cell array 12, the third cell array 13, and the fourth cell array 14, respectively.

However, since no global bit line 24 is formed in the first cell array 11, the parasitic capacitance formed by the global bit line 24 may be reduced and the high-speed operation may be provided accordingly. Moreover, the overall operating speed may also be improved by the high-speed operation in the first cell array 11.

In addition, the difference between the operating speed in the first cell array 11 and those in the second cell array 12, the third cell array 13, and the fourth cell array 14 may be adjusted by regulating the operational timing in the local sense amplifier 23, etc.

Second Embodiment

A second embodiment relates to a semiconductor memory device configured in such a way that a capacitance formed by the memory cells in the first cell array 11 in the first embodiment is substantially the same as a capacitance formed by the memory cells in another sub-array than the first cell array 11 (i.e., the second cell array 12, the third cell array 13, or the fourth cell array 14).

Figure 2:
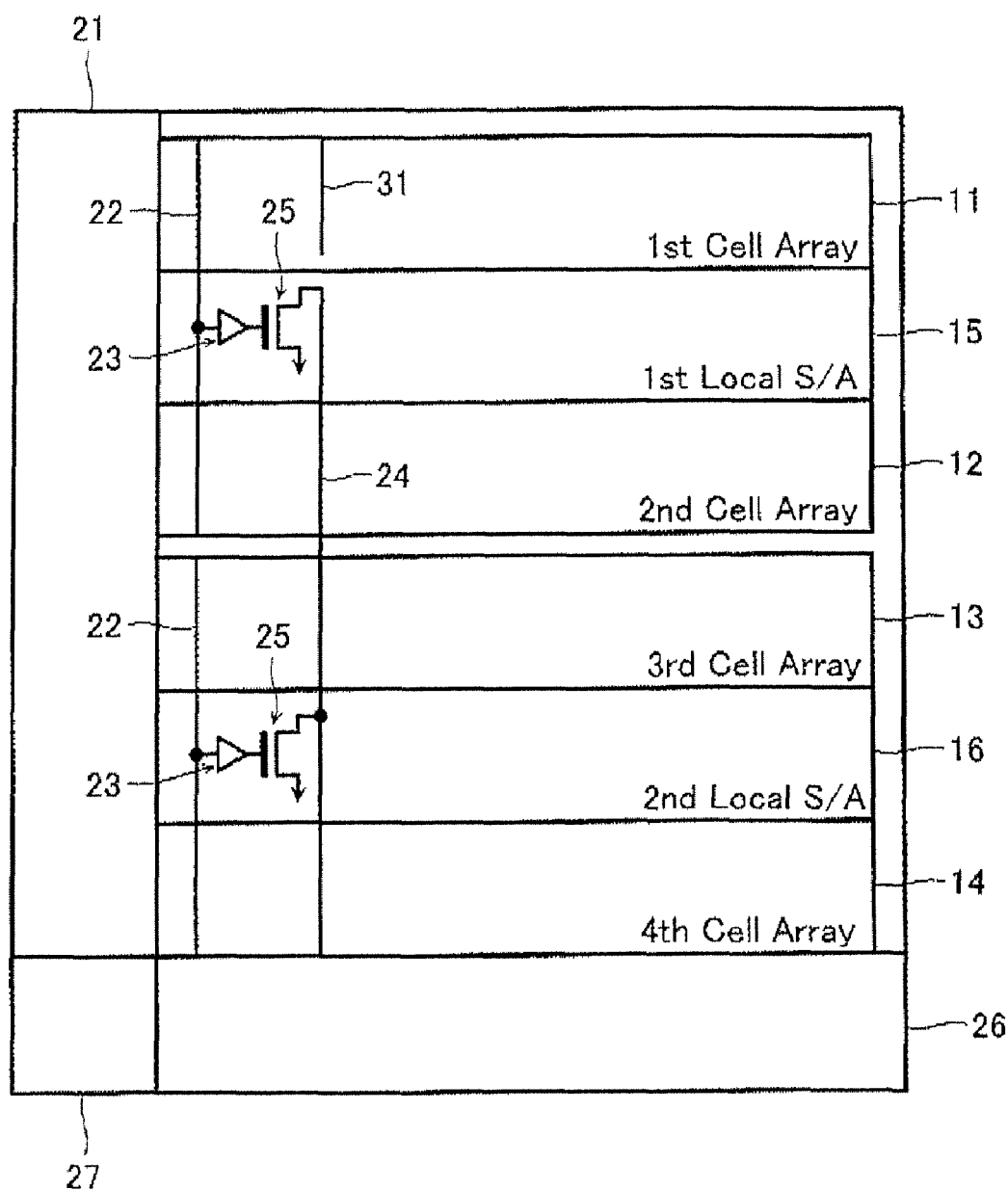
FIG. 2 is a configuration diagram of a semiconductor memory device according to a second embodiment.

Now, the second embodiment will be described below based on FIG. 2. In this embodiment, a dummy wiring 31, is formed in the first cell array 11 with substantially the same width as the global bit line 24 formed in the second cell array 12, the third cell array 13, and the fourth cell array 14. As a result, a parasitic capacitance is formed in the first cell array 11 by the local bit line 22 and the dummy wiring 31. The dummy wiring 31 is formed in such a way that a capacitance formed by the memory cells in the first cell array 11 is substantially the same as a capacitance formed by the memory cells in the second cell array 12, the third cell array 13, or the fourth cell array 14. Note that other configurations than that of the dummy wiring 31 are similar to the first embodiment.

With this configuration, the time delay caused by the parasitic capacitance in the memory cells in the first cell array 11 is substantially the same as those in the memory cells in the second cell array 12, the third cell array 13, or the fourth cell array 14. This would eliminate the need for adjusting the timing of reading operation and simplify the circuit configuration for control. In addition, the dummy wiring 31 is not connected to the global bit line 24. Therefore, the parasitic capacitance formed by the global bit line 24 would be similar to the first embodiment, which may enable the high-speed operation.

Third Embodiment

A third embodiment is configured to form a power-supply wiring for providing a supply voltage to memory cells, in place of the dummy wiring 31 formed in the second embodiment.

Figure 3:
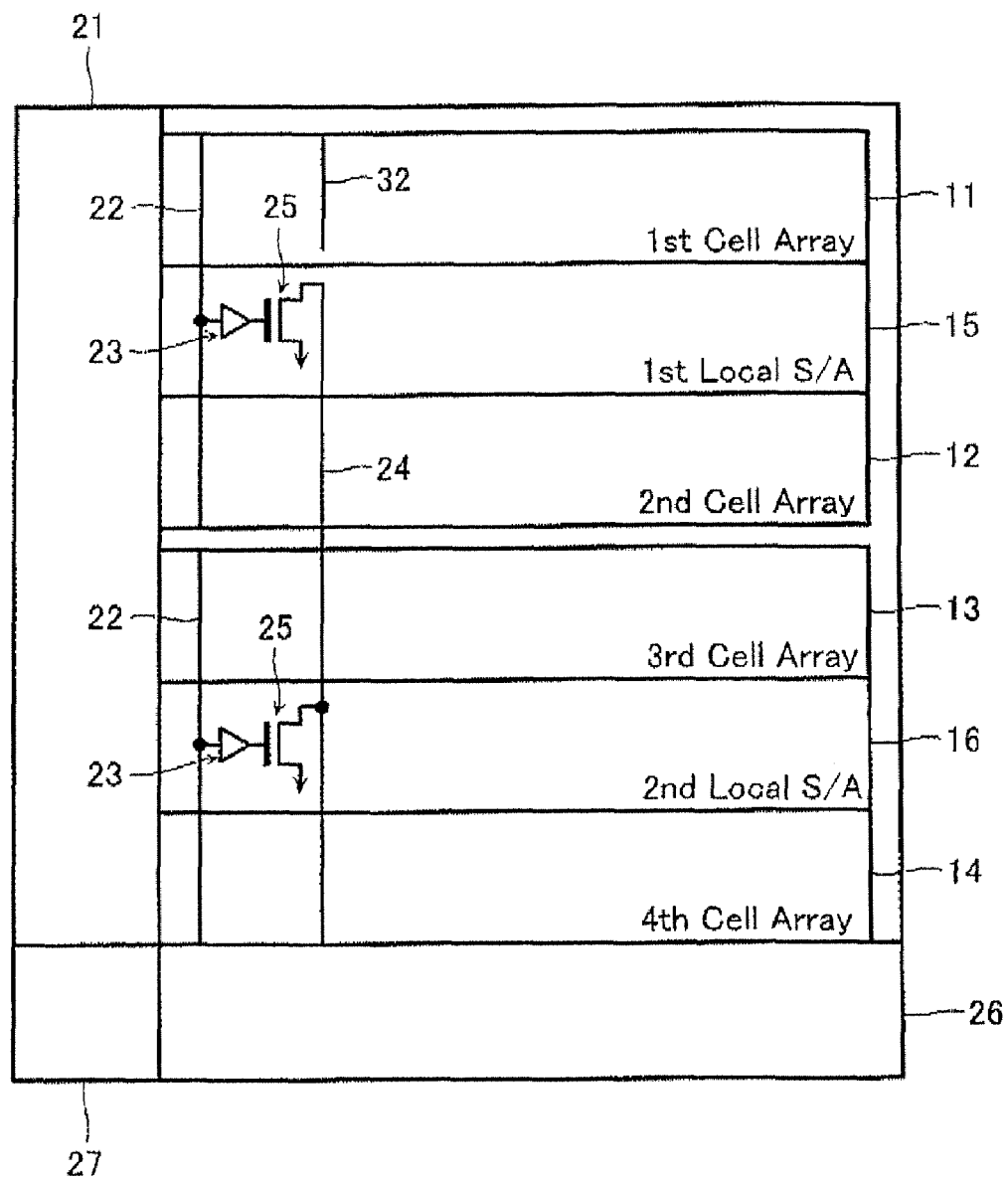
FIG. 3 is a configuration diagram of a semiconductor memory device according to a third embodiment.

Now, the third embodiment will be described below based on FIG. 3. In this embodiment, a power-supply wiring 32 is formed in the first cell array 11. The power-supply wiring 32 has the same width as that of the global bit line 24 formed in the second cell array 12, the third cell array 13, and the fourth cell array 14. As a result, a parasitic capacitance is formed in the first cell array 11 by the local bit line 22 and the power-supply wiring 32. The power-supply wiring 32 is formed in such a way that a capacitance formed by the memory cells in the first cell array 11 is substantially the same as a capacitance formed by the memory cells in the second cell array 12, the third cell array 13, or the fourth cell array 14. Note that other configurations than that of the power-supply wiring 32 are similar to the first embodiment.

With this configuration, the time delay caused by the parasitic capacitance in the memory cells in the first cell array 11 is substantially the same as those in the memory cells in the second cell array 12, the third cell array 13, or the fourth cell array 14. This would eliminate the need for adjusting the timing of reading operation and simplify the circuit configuration for control.

In addition, since the power-supply wiring 32 may be extended to the first memory cell array 11, any voltage drop may be prevented from arising in driving memory cells. Further, the power-supply wiring 32 is not connected to the global bit line 24. Therefore, the parasitic capacitance formed by the global bit line 24 would be similar to the first embodiment, which may enable the high-speed operation.

Fourth Embodiment

A fourth embodiment is configured to provide a replica cell for determining the timing for sensing the first local sense amplifier region 15 and the second local sense amplifier region 16 and performing a pre-charge operation, as well as the fall time for the word lines.

Figure 4:
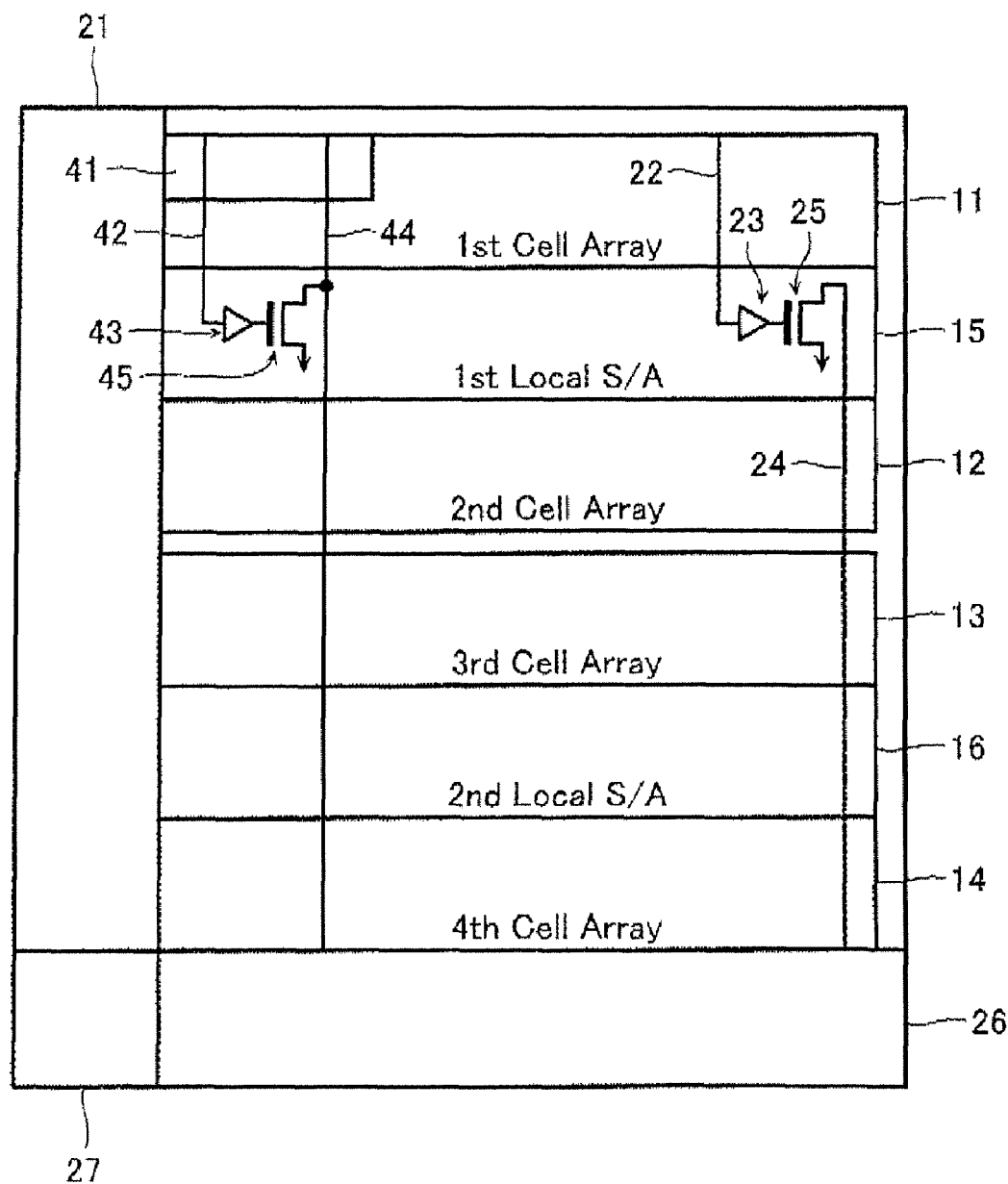
FIG. 4 is a configuration diagram of a semiconductor memory device according to a fourth embodiment.

Now, the fourth embodiment will be described below based on FIG. 4. In this embodiment, a replica cell 41 is provided in the first cell array 11. In addition, a replica local bit line 42, a local sense amplifier 43, a replica global bit line 44, and an n-type MOS transistor 45 are also provided herein, each of which are necessary for the replica cell 41.

As the replica global bit line 44 is formed so as to extend to the first cell array 11, the replica global bit line 44 is formed to be longer than a normal global bit line 24. Thus, in the replica global bit line 44, there would be formed a larger parasitic capacitance than in the normal global bit lines 24, which could decrease the operating speed. In contrast, since the operating speed in the normal global bit lines 24 would not be decreased, the overall operating speed may be improved accordingly.

Figure 5:
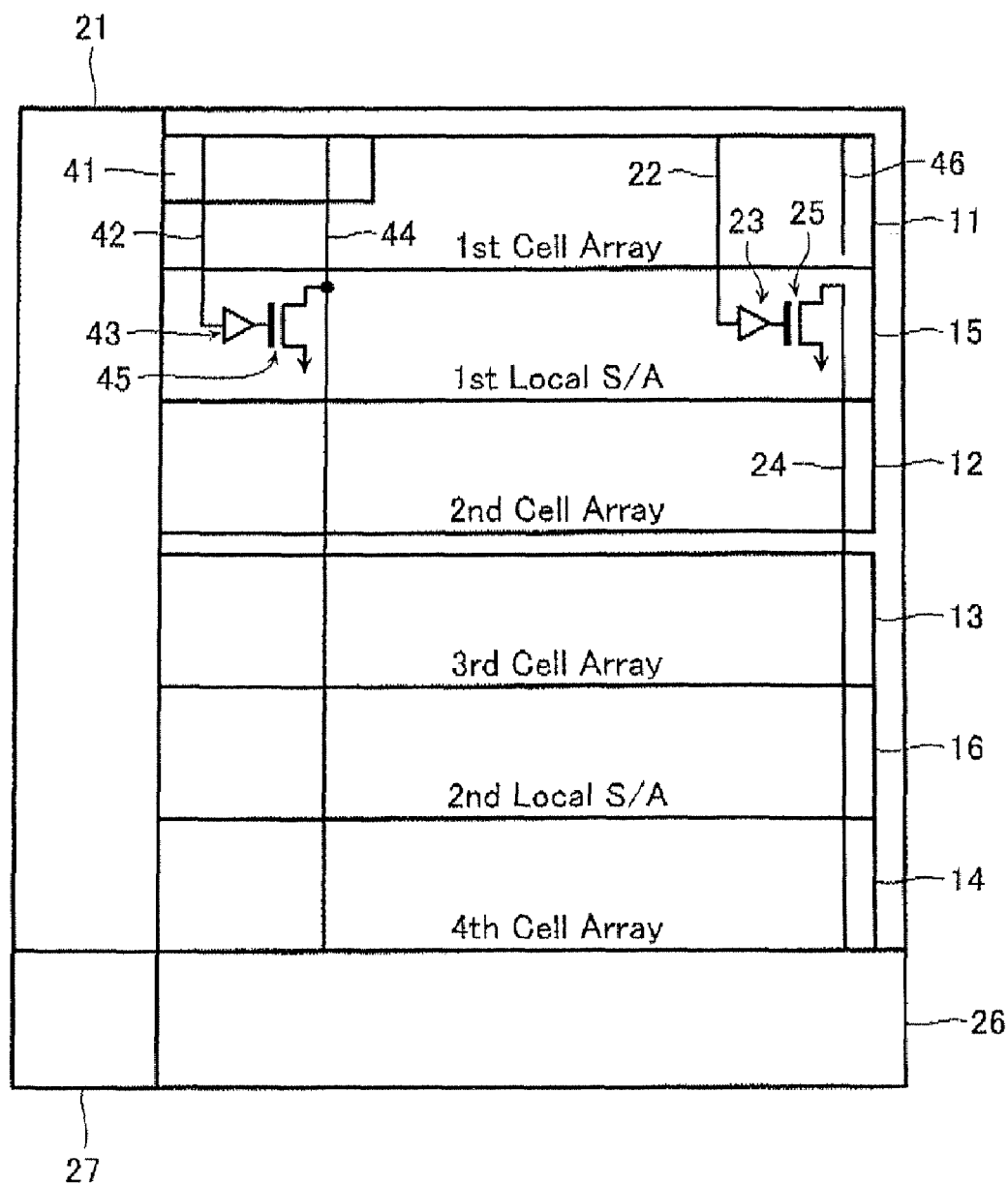
FIG. 5 is a configuration diagram of another semiconductor memory device according to the fourth embodiment.

Similar to the second and third embodiments, FIG. 5 illustrates a configuration in which a metal, wiring 46 as a dummy wiring or a power-supply wiring is provided in this embodiment. As a result, a uniform parasitic capacitance may be obtained from the memory cells in the first cell array 11. In addition, the need for adjusting the timing of operation may be eliminated. Furthermore, driving circuitry may be simplified.

Although the semiconductor memory device according to the present invention have been described in detail with reference to exemplary embodiments thereof, the present invention is not limited to the above-mentioned embodiments and may take any other forms than those specifically described herein. For example, those configurations illustrated in FIGS. 3-5 may be combined as required.

What is claimed is:

1. A semiconductor memory device comprising:
   a plurality of sub-arrays each with a plurality of memory cells arranged in matrix form;
   a local bit line connected to a plurality of memory cells which are arranged in column direction in the sub-arrays;
   a global bit line connected to a plurality of local bit lines; and
   a column decoder connected to the global bit line,
   wherein the global bit line extends from the column decoder toward the plurality of sub-arrays, while ending before a furthest sub-array of the plurality of sub-arrays from the column decoder,
   one or more local sense amplifier regions are provided between the plurality of sub-arrays, and
   the furthest sub-array is formed in a region further away from a local sense amplifier region formed in a furthest position to which the global bit line extends from the column decoder.

2. The semiconductor memory device according to claim 1, wherein
   a dummy wiring disconnected from the global bit line is formed in the furthest sub-array in such a way that a capacitance formed by memory cells in another sub-array in the semiconductor memory device than the furthest sub-array is substantially the same as a capacitance formed by memory cells in the furthest sub-array.

3. The semiconductor memory device according to claim 1, wherein
   a power-supply wiring for providing a power supply to memory cells is formed in the furthest sub-array in such a way that a capacitance formed by memory cells in another sub-array in the semiconductor memory device than the furthest sub-array is substantially the same as a capacitance formed by memory cells in the furthest sub-array.

4. The semiconductor memory device according to claim 1, wherein
   a dummy wiring disconnected from the global bit line is formed in the furthest sub-array in such a way that a capacitance formed by memory cells in another sub-array in the semiconductor memory device than the furthest sub-array is substantially the same as a capacitance formed by memory cells in the furthest sub-array, and
   a power-supply wiring for providing a power supply to memory cells is formed in the furthest sub-array in such a way that a capacitance formed by memory cells in another sub-array in the semiconductor memory device than the furthest sub-array is substantially the same as a capacitance formed by memory cells in the furthest sub-array.

5. The semiconductor memory device according to claim 1, further comprising:
   a replica cell formed in the furthest sub-array;
   a dummy local bit line connected to the replica cell; and
   a dummy global bit line formed in sub-arrays including the furthest sub-array and connected to a plurality of dummy local bit lines.

6. A semiconductor memory device comprising:
   a plurality of sub-arrays each with a plurality of memory cells arranged in matrix form;
   a plurality of local bit lines connected to a plurality of memory cells which are arranged in column direction in the sub-arrays;
   a global bit line connected to the plurality of local bit lines; and
   a column decoder connected to the global bit line,
   wherein the global bit line extends from the column decoder toward the plurality of sub-arrays, while ending before a furthest sub-array of the plurality of sub-arrays from the column decoder,
   one or more local sense amplifier regions are provided between the plurality of sub-arrays, and
   the furthest sub-array is formed in a region further away from a local sense amplifier region formed in a furthest position to which the global bit line extends from the column decoder.

7. The semiconductor memory device according to claim 6, wherein
   a dummy wiring disconnected from the global bit line is formed in the furthest sub-array in such a way that a capacitance formed by memory cells in another sub-array in the semiconductor memory device than the furthest sub-array is substantially the same as a capacitance formed by memory cells in the furthest sub-array.

8. The semiconductor memory device according to claim 6, wherein
   a power-supply wiring for providing a power supply to memory cells is formed in the furthest sub-array in such a way that a capacitance formed by memory cells in another sub-array in the semiconductor memory device than the furthest sub-array is substantially the same as a capacitance formed by memory cells in the furthest sub-array.

9. The semiconductor memory device according to claim 6, wherein
   a dummy wiring disconnected from the global bit line is formed in the furthest sub-array in such a way that a capacitance formed by memory cells in another sub-array in the semiconductor memory device than the furthest sub-array is substantially the same as a capacitance formed by memory cells in the furthest sub-array, and
   a power-supply wiring for providing a power supply to memory cells is formed in the furthest sub-array in such a way that a capacitance formed by memory cells in another sub-array in the semiconductor memory device than the furthest sub-array is substantially the same as a capacitance formed by memory cells in the furthest sub-array.

10. The semiconductor memory device according to claim 6, further comprising:
  a replica cell formed in the furthest sub-array;
  a dummy local bit line connected to the replica cell; and
  a dummy global bit line formed in sub-arrays including the furthest sub-array and connected to a plurality of dummy local bit lines.

* * * * *